(12) United States Patent
Ekstrand et al.

(10) Patent No.: US 8,180,818 B2
(45) Date of Patent: *May 15, 2012

(54) PARTIALLY COMPLEX MODULATED FILTER BANK

(75) Inventors: Per Ekstrand, Stockholm (SE); Lars Villemoes, Jaerfaella (SE); Heiko Purnhagen, Sundbyberg (SE)

(73) Assignee: Dolby International AB, Amsterdam Zuid-Oost (NL)

( * ) Notice: Subject to any disclaimer, the term of this patent is extended or adjusted under 35 U.S.C. 154(b) by 183 days.

This patent is subject to a terminal disclaimer.

(21) Appl. No.: 12/716,739

(22) Filed: Mar. 3, 2010

(65) Prior Publication Data

US 2011/0106541 A1  May 5, 2011

Related U.S. Application Data

(62) Division of application No. 11/463,263, filed on Aug. 8, 2006, now Pat. No. 7,917,561.

(60) Provisional application No. 60/733,682, filed on Nov. 3, 2005.

(30) Foreign Application Priority Data

Sep. 16, 2005 (SE) ........................ 0502049

(51) Int. Cl.
*G06F 17/10* (2006.01)
(52) U.S. Cl. ..................................... 708/300
(58) Field of Classification Search ........... 708/300–322
See application file for complete search history.

(56) References Cited

U.S. PATENT DOCUMENTS

| | | | |
|---|---|---|---|
| 6,947,509 B1 | 9/2005 | Wong | |
| 7,069,212 B2 | 6/2006 | Tanaka et al. | |
| 7,242,710 B2 | 7/2007 | Ekstrand | |
| 7,433,463 B2* | 10/2008 | Alves et al. | 379/406.14 |
| 7,433,907 B2 | 10/2008 | Nagai et al. | |
| 7,519,528 B2* | 4/2009 | Liu et al. | 704/2 |
| 7,555,434 B2* | 6/2009 | Nomura et al. | 704/500 |
| 2003/0016772 A1 | 1/2003 | Ekstrand | |

FOREIGN PATENT DOCUMENTS

| | | |
|---|---|---|
| JP | 61-220519 | 9/1986 |
| JP | 2004-53895 | 2/2004 |
| JP | 2004-533155 | 10/2004 |
| JP | 2005-148274 | 6/2005 |

(Continued)

OTHER PUBLICATIONS

Ekstrand, Per, "Bandwidth Extension of Audio Signals", Proc. 1st IEEE Benelux Workshop on Model Based Processing and Coding of Audio (MPCA-2002), Leuven, Belgium, (Nov. 15.

(Continued)

*Primary Examiner* — Tan Mai
(74) *Attorney, Agent, or Firm* — Michael A. Glenn; Glenn Patent Group

(57) ABSTRACT

An apparatus for processing a plurality of real-valued subband signals using a first real-valued subband signal and a second real-valued subband signal to provide at least a complex-valued subband signal comprises a multiband filter for providing an intermediate real-valued subband signal and a calculator for providing the complex-valued subband signal by combining a real-valued subband signal from the plurality of real-valued subband signals and the intermediate subband signal.

19 Claims, 7 Drawing Sheets

Partially complex analysis filter bank

FOREIGN PATENT DOCUMENTS

| | | |
|---|---|---|
| JP | 2005-520219 | 7/2005 |
| WO | WO02/080362 | 10/2002 |
| WO | WO 2004/093495 | 10/2004 |
| WO | WO 2007/031171 | 3/2007 |

OTHER PUBLICATIONS

J. Herre et al., "The Reference Model Architecture for MPEG Spatial Audio Coding", Audio Engineering Society Convention Paper 6447, Presented at the 118th Convention, Barcelon.

Schuijers, Erik et al., "Low Complexity Parametric Stereo Coding", Audio Engineering society Convention Paper 6073, Presented at the 116th Convention, Berlin, Germany (May 8-1.

Shimada, Osamu et al., "A Low Power SBR Algorithm for the MPEG-4 Audio Standard and its DSP Implementation", Audio Engineering Society Convention Paper 6048, Presented at the.

Official Communication issued in interational Patent Application No. PCT/JP2004/011249, mailed on May 18, 2006, 3 pages.

English Translation of a Japanese Office Action mailed May 25, 2010 in parallel Japanese patent application No. 2007-538442; 2 pages.

Office Action and English Translation, dated Sep. 17, 2010, in parallel Chinese patent application No. 200680000922.6, 12 pages.

* cited by examiner

PARTIALLY COMPLEX MODULATED FILTER BANK

CROSS REFERENCE TO RELATED APPLICATIONS

This Application is a divisional of U.S. patent application Ser. No. 11/463,263, entitled Partially Complex Modulated Filter Bank, filed 8 Aug. 2006 now U.S. Pat. No. 7,917,561 which claims priority to U.S. Provisional Application No. 60/733,682, entitled Partially Complex Modulated Filter Bank, filed 3 Nov. 2005, and also claims priority to Swedish Patent Application No. 0502049-0, filed 16 Sep. 2005, all of which are incorporated herein in its entirety by this reference thereto.

FIELD OF THE INVENTION

The present invention relates to an apparatus and method for processing a plurality of complex-valued subband signals and an apparatus and method for processing a plurality of real-valued subband signals, especially in the field of encoding and decoding of audio signals.

BACKGROUND OF THE INVENTION AND PRIOR ART

It has been shown in [P. Ekstrand, "Bandwidth extension of audio signals by spectral band replication", Proc. $1^{st}$ IEEE Benelux Workshop on Model based Processing and Coding of Audio (MPCA-2002), pp. 53-58, Leuven, Belgium, 2002], that a complex-exponential modulated filter bank is an excellent tool for spectral envelope adjustment of audio signals. One application of this feature is audio coding based on Spectral Band Replication (SBR). Other fruitful applications of a complex filter bank include frequency selective panning and spatialization for parametric stereo, see [E. Schuijers, J. Breebart, H. Purnhagen, J. Engdegård: "Low complexity parametric stereo coding", Proc. $116^{th}$ AES convention, 2004, paper 6073] and parametric multichannel coding, see [J. Herre et al.: "The reference model architecture for MPEG spatial audio coding", Proc. $118^{th}$ AES convention, 2005, paper 6447]. In those applications the frequency resolution of the complex filter bank is further enhanced at low frequencies by means of sub-subband filtering. The combined hybrid filter bank hereby achieves a frequency resolution that enables the processing of spatial cues at a spectral resolution which closely follows the spectral resolution of the binaural auditory system. The additional filtering introduces no aliasing in itself, even if modifications are applied, so the quality of the hybrid filter bank is determined by the aliasing properties of the first filter bank.

If restraints on computational complexity prevent the usage of a complex exponential modulated filter bank, and only allows for a cosine modulated (real-valued) implementation, severe aliasing is encountered when the filter bank is used for spectral envelope adjustment. As shown in [O. Shamida et al.: "A low power SBR algorithm for the MPEG-4 audio standard and its DSP implementation", Proc. $116^{th}$ AES convention, 2004, paper 6048] adaptive subband gain grouping (or gain locking) can alleviate the aliasing to some extent. However, this method works best when only high frequency components of the signal have to be modified. For panning purposes in parametric multichannel coding, the amount of gain locking necessary to render the aliasing at lower frequencies inaudible will strongly reduce the frequency selectivity of the filter bank tool and will in practice render the additional frequency selectivity of a hybrid filter bank unreachable. The result is a rather narrow sound impression and problems with correct sound source placement. A much better compromise between quality and complexity would be obtained if the complex signal processing could be kept only for the perceptually more important lower frequencies.

SUMMARY OF THE INVENTION

It is the object of the present invention to provide a more efficient concept for providing a signal allowing a manipulation with better quality and a more efficient concept for reducing a signal with less distortions.

The present invention describes an apparatus for processing a plurality of real-valued subband signals, the plurality of real-valued subband signals comprising a first real-valued subband signal and a second real-valued subband signal to provide at least a complex-valued subband signal, comprising a multiband filter for providing an intermediate real-valued subband signal by filtering the first subband signal to provide a first filtered subband signal and the second real-valued subband signal to obtain a second filtered subband signal and by combining the first and the second filtered subband signals to provide the real-valued intermediate subband signal and a calculator for providing the complex-valued subband signal by combining a real-valued subband signal from the plurality of real-valued subband signals as the real part of the complex-valued subband signal and the intermediate subband signal as an imaginary part of the complex-valued subband signal.

As a second aspect of the present invention, the present invention describes an apparatus for processing a plurality of complex-valued subband signals, the plurality of complex-valued subband signals comprising a first complex-valued subband signal and a second complex-valued subband signal to obtain a real-valued subband signal, comprising an extractor for extracting from the first complex-valued subband signal a first imaginary part for extracting from the second complex-valued subband signal a second imaginary part and for extracting from the first, the second or a third complex-valued subband signal of the plurality of complex-valued subband signals a real part, a multiband filter for providing a real-valued intermediate subband signal by filtering the first imaginary part to provide a first filtered imaginary part signal, by filtering the second imaginary part to provide a second filtered imaginary part signal and by combining the first and the second filtered imaginary part signals to provide the intermediate subband signal, and a calculator for providing the real-valued subband signal by combining the real part signal and the intermediate signal.

The present invention is based on the finding that a plurality of real-valued subband signals can be processed to provide at least one complex-valued subband signal allowing a manipulation with a better quality than a manipulation of the plurality of real-valued subband signals, wherein a computational complexity of the processing of the plurality of real-valued subband signals is only slightly increased. To be more precise, the present invention is based on the fact that a plurality of real-valued subband signals can be processed by a multiband filter and by a calculator to obtain a complex-valued subband signal which can be manipulated far more easily without creating a significant number of distortions and minimal aliasing as compared to directly manipulating the plurality of real-valued subband signals.

In one embodiment of the present invention, an inventive apparatus for processing a plurality of real-valued subband signals is described, which provides a plurality of complex-valued subband signals from a subset of the plurality of real-valued subband signals, wherein a second subset of the plurality of real-valued subband signals is provided as a further plurality of real-valued subband signals without being processed into a corresponding number of complex-valued subband signals. Hence, this embodiment represents a partially complex modulated analysis filter bank, wherein the complex-valued subband signals will have the same advantages as corresponding subband signals from a complex exponentially modulated filter banks in terms of stability of energy estimation at minimal aliasing arising from linear time invariant modifications such as a level of adjustment and further filtering. Furthermore, as an additional advantage, the computational complexity as compared with a complex filter bank for processing complex-valued signals is significantly reduced.

As will be explained later, further embodiments of the present invention can also comprise modifications and modifier introducing time variance and/or non-linear manipulations. Examples for such embodiments come from the fields of high quality SBR, varying applications of spatial parameters and other applications. In these embodiments, all advantageous properties of the manipulators of the corresponding complex bank are present in the complex part of the partially complex filter bank of the embodiments of the present invention.

In a further embodiment of the present invention the further plurality of real-valued subband signals, passed on by the inventive apparatus for processing the plurality of real-valued subband signals is delayed by a delayer to ensure a timely synchronicity with respect to the complex-valued subband signals output by the inventive apparatus.

The second aspect of the present invention is based on the finding that a plurality of complex-valued subband signals can be more efficiently reduced to a real-valued subband signal with less distortions and minimal aliasing by extracting from at least two complex-valued subband signals real-valued imaginary parts of the at least two complex-valued subband signals and by extracting from the first, the second or a third complex-valued subband signal a real part by an extractor, by a multiband filter for providing an intermediate signal based on the imaginary parts and by a calculator for providing the real-valued subband signal by combining the real part signal and the intermediate signal. To be more precise, the present invention is based on the finding that prior to an optional real synthesis another multiband filter converts the complex-valued subband signals back to real-valued subband signals, wherein the overall quality of reconstruction and signal processing behavior is in line with that of a complex filter bank.

Depending on the concrete implementations of the embodiments, the extractor can also be implemented as a separator, if for instance more than just one real-valued subband signal is to be provided. In this case it might be useful to extract from all complex-valued subband signals their appropriate real parts and imaginary parts for further processing.

On the contrary, even if only a single real-valued subband signal is to be obtained based on three or more different complex-valued subband signals, the extractor can be implemented as a separator, which separates each complex-valued subband signal into both its real parts and imaginary parts. In this case, the imaginary part signals and the real part signals not required in the further process can simply be neglected. Hence, the terms separator and extractor can be synonymously used in the framework of the present application.

Furthermore, in the frame work of the present application, imaginary part signals and imaginary parts as well as real parts and real part signals refer to both signals having values, which correspond to either an imaginary part or a real part of a value of complex subband signals. In this context, it should also be noted that in principle both, any imaginary part signal and any real part signal can be either real-valued or complex-valued.

In one embodiment of the present invention, an inventive apparatus for processing a plurality of complex-valued subband signals is also provided with a plurality of real-valued subband signals, wherein the plurality of complex-valued subband signals is processed as described in the above terms and wherein the plurality of real-valued subband signals is provided in an unfiltered form at an output of the apparatus. Hence, this embodiment forms a partially complex modulated synthesis filter bank. A major advantage of this embodiment is that the overall quality of reconstruction and signal processing behavior is in line with that of a complex filter bank with respect to the plurality of complex-valued subband signals and in line with that of a real filter bank in the remaining frequency range represented by the plurality of real-valued subband signals. As an additional advantage of the embodiments, the computational complexity is only slightly increased compared to that of a real-valued filter bank. Furthermore, as an additional advantage of the embodiments a seamless transition between the two frequency ranges represented by both, the plurality of complex-valued subband signals and the plurality of real-valued subband signals arises from a particular edge band treatment. Furthermore, as an additional advantage, the computational complexity as compared with a complex filter bank for processing complex-valued signals is significantly reduced.

A further embodiment of the present invention describes a system which combines both, an inventive apparatus for processing a plurality of real-valued subband signals and an inventive apparatus for processing a plurality of complex-valued subband signals, wherein both inventive apparatuses also pass on a further plurality of real-valued subband signals. In between the two inventive apparatuses a first and a second manipulator modify the plurality of complex-valued subband signals output by the inventive apparatus for processing a plurality of real-valued subband signals and modify the further plurality of real-valued subband signals, respectively. The first and the second manipulator can perform linear time invariant modifications such as an envelope adjustment or a filtering. As a consequence, in the system described, the overall quality of reconstruction and signal processing behavior is with respect to the frequency range represented by the plurality of complex-valued subband signals in line with that of a complex filter bank and with respect to the frequency range represented by the further plurality of real-valued subband signals in line with that of a real filter bank, leading to a manipulation of the signals with a far better quality as compared to directly modifying the plurality of real-valued subband signals, while the computational complexity is only slightly increased. As outlined before and more closely explained later, the manipulators of other embodiments are not limited to linear and/or time invariant manipulations.

In a further embodiment of the inventive apparatus for processing a plurality of complex-valued subband signals a further plurality of real-valued subband signals is passed on in a delayed form by employing a delayer to ensure a timely synchronicity with respect to the real-valued subband signal output by the inventive apparatus for processing a plurality of complex-valued subband signals.

BRIEF DESCRIPTION OF THE DRAWINGS

The present invention will now be described by way of illustrative examples, not limiting the scope or spirit of the invention, with reference to the accompanying drawings. Preferred embodiments of the present invention are subsequently described by the following drawings, wherein.

DETAILED DESCRIPTION OF PREFERRED EMBODIMENTS

The below-described embodiments are merely illustrative for the principles of the present invention of a partially complex modulated filter bank. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Figure 1:
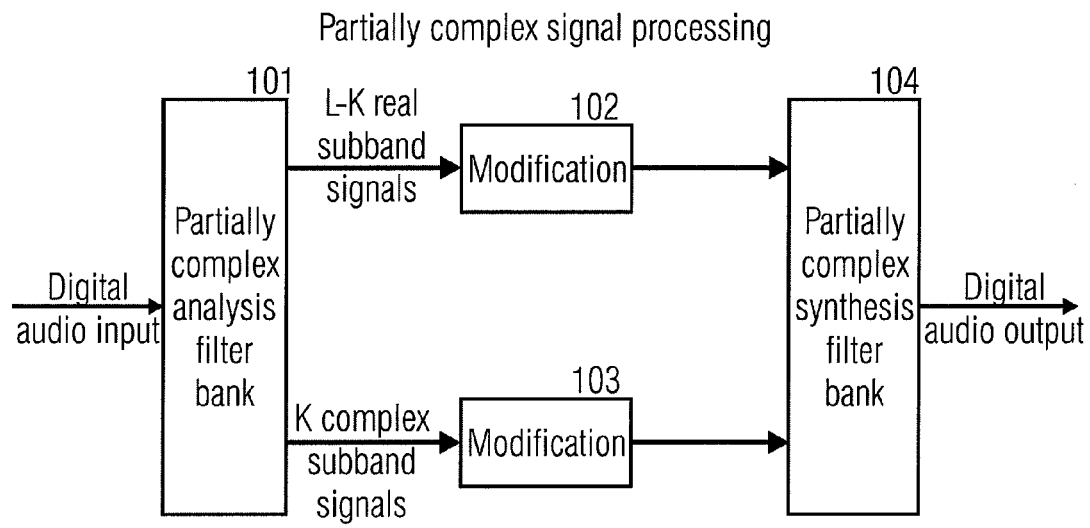
FIG. 1 illustrates partially complex signal processing.

FIG. 1 illustrates the principle of partially complex signal processing based on a partially complex analysis 101 and synthesis 104 filter banks. A digital audio input signal is fed into to the partially complex analysis filter bank 101. Out of a total of L subband signals, this analysis bank outputs K complex and (L-K) real subband signals, wherein K and L are positive integers and $K \leq L$. A first modification 102 is performed on the real subband signals and a second modification 103 is performed on the complex signals. These modifications both aim at shaping the audio signal in time and frequency. The modified subband signals are subsequently fed into a partially complex synthesis filter bank 104 which produces as output the processed digital audio signal.

Figure 2:
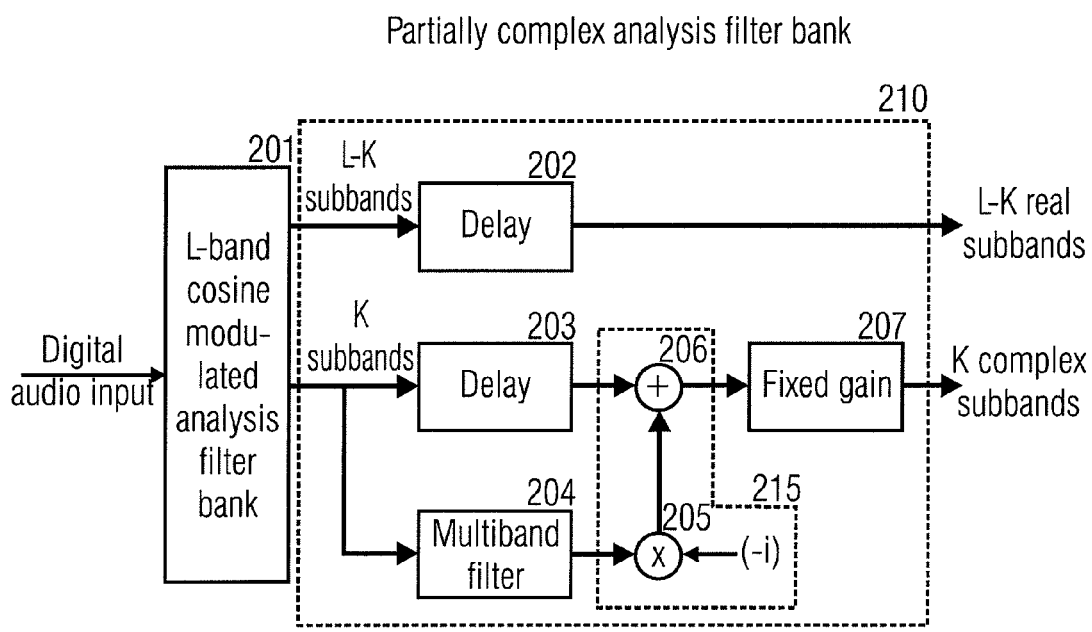
FIG. 2 illustrates a partially complex analysis filter bank.

FIG. 2 illustrates the components of an embodiment of a partially complex analysis filter bank 101 as taught by the present invention. The digital audio input signal is analyzed by an L-band cosine modulated filter bank 201 which at the output splits the L real subband signals into two groups. The first group consisting of K real subband signals is filtered by the multiband filter 204 whose output is multiplied by the negative of the imaginary unit in the multiplier 205 and added in 206 to the K real subband signals delayed by 203 in order to produce K complex subband signals. Those subband signals are gain adjusted by a fixed real gain 207 and output as the K complex subbands of the partially complex analysis. The second group consisting of (L-K) real subband signals are fed to the delay unit 202 whose output constitutes the real subbands of the partially complex analysis.

The amount of delay in both 202 and 203 is adjusted in order to compensate for the delay introduced by the multiband filter 204. The delayer 202, the delayer 203, the multiband filter 204, the multiplier 205, the adder 206 and the fixed real gain adjustment 207 form a real to complex converter 210, which is provided with a plurality of K real-valued subband signals and a further plurality of (L-K) real-valued subband signals providing K complex-valued subband signals and (L-K) real-valued subband signals. Furthermore, the multiplier 205 and the adder 206 form a calculator 215, which provides at least one complex-valued subband signal based on at least one real-valued subband signal as a real part signal and on at least one real-valued subband signal as an imaginary part of the complex-valued subband signal.

Figure 3:
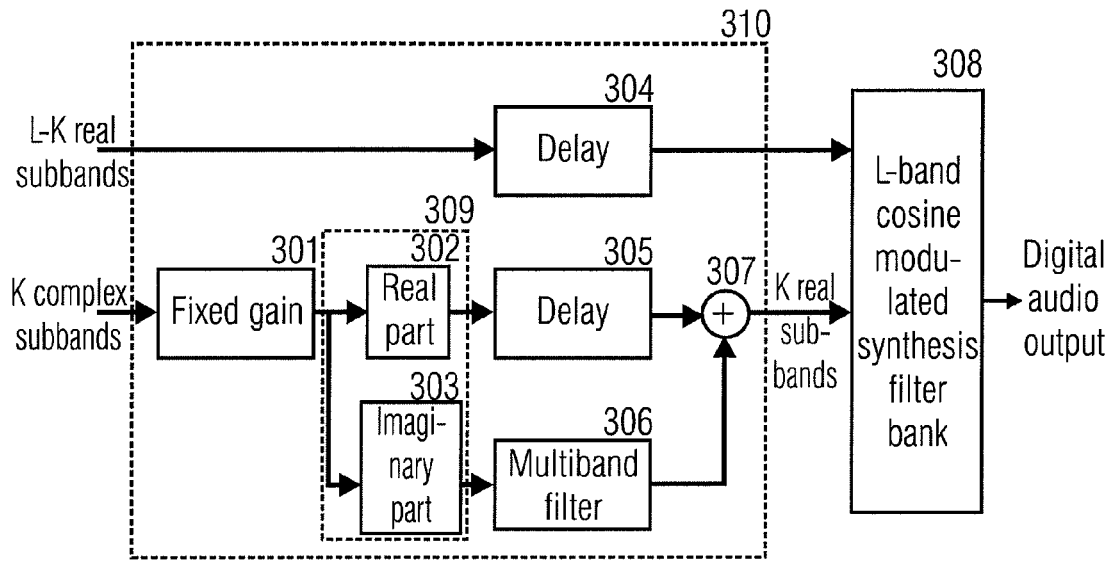
FIG. 3 illustrates a partially complex synthesis filter bank.

FIG. 3 illustrates the components of an embodiment of a partially complex synthesis filter bank 104 as taught by the present invention. The (L-K) real subband signals are simply delayed in 304 and fed into (L-K) inputs of the L-band cosine modulated synthesis filter bank 308. The K complex subbands are first gain adjusted by a fixed real gain 301. Then the real and the imaginary parts of the complex subband signals are extracted in 302 and 303 respectively. The imaginary parts of the subbands are filtered by the multiband filter 306 whose output is added in 307 to the real parts of the subbands delayed by 305. The amount of delay in both 304 and 305 is adjusted in order to compensate for the delay introduced by the multiband filter 306. The output of the adder 307 is fed into remaining K inputs of the L-band cosine modulated synthesis filter bank 308. The real part extractor 302 and the imaginary part extractor 303 together form a separator 309 for separating a complex-valued subband signal into a real-valued real part signal and the real-valued imaginary part signal. To be more precise, the real part extractor 302 provides the real part signal and the imaginary part extractor 303 provides the imaginary part signal. In a special embodiment shown in FIG. 3, the separator 309 processes or rather separates K complex-valued subband signals into K real-valued real part signals and K real-valued imaginary part signals.

Nevertheless, as described above, the separator 309 can also be implemented as an extractor, which is adapted for not separating all complex-valued subband signals into real part signals and imaginary part signals. Hence, the separator 309 is also synonymously referred to as extractor 309 for extracting real part signals (real parts) and imaginary part signals (imaginary parts) from complex-valued subband signals.

The fixed real gain adjuster 301, the separator 309, which comprises the real part extractor 302 and the imaginary part extractor 303, the delayer 304, the delayer 305, the multiband filter 306 and the adder 307 together form an inventive complex to real converter 310, which is capable of converting K complex-valued subband signals into K real-valued subband signals and providing (L-K) real-valued subband signals in a is delayed form at an output of the complex to real converter 310.

Figure 4:
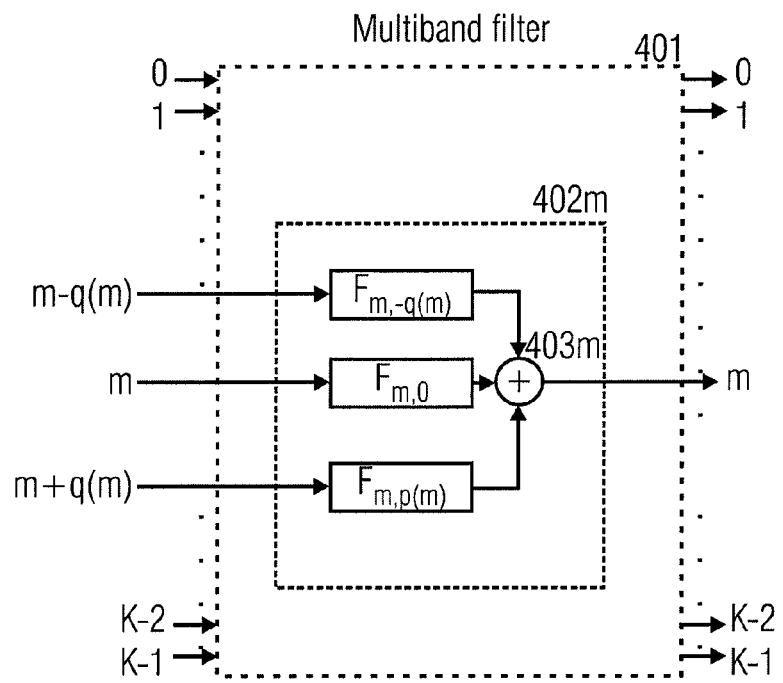
FIG. 4 illustrates multiband filtering.

FIG. 4 illustrates the operation of a multiband filter 401 that takes K real subband signals as inputs 0, 1, 2, . . . , (K−1) and gives K real subband signals as outputs 0, 1, 2, . . . (K−1). In the language of linear systems this is simply a linear time invariant discrete-time multiple input multiple output (MIMO) system. The m th output is produced in 402m by filtering the (q(m)+p(m)+1) inputs (m−q(m)), . . . , m, . . . , (n+p(m)) with the filters $F_{m,-q(m)}, \ldots, F_{m,0}, \ldots, F_{m,+p(m)}$ respectively and summing the results in 403*m*. The constraints $(m-q(m)) \geq 0$ and $(m+p(m)) \leq K-1$ must hold. As outlined in the following description, the present invention teaches how to obtain a complex representation of high quality by using multiband filters 204 and 306 of low computational complexity that have $$q(m) = \begin{cases} 0, & \text{for } m = 0 \\ 1, & \text{for } m = 1, \ldots, K-1 \end{cases}, \quad (1)$$

and $$p(m) = \begin{cases} 1, & \text{for } m = 0, \ldots, K-2 \\ 0, & \text{for } m = K-1 \end{cases}. \quad (2)$$

Moreover, similarities of the filters $F_{m,-1}$ and $F_{m,1}$ can be exploited to reduce complexity even further.

The particularly small values of q(m) and p(m) as described by (1) and (2) can be used when prototype filter of the cosine modulated filter bank has a sufficiently high degree of stop band attenuation. This implicitly requires a certain minimal length of prototype filter. For shorter prototype filters, the values of q(m) and p(m) have to be increased. However, the method taught by the present invention remains computationally efficient since the length of filters $F_{m,r}$ is proportional to the length of the prototype filter.

The filters implemented in the multiband filter 401 can be in principle all kinds of filters with all kinds of filter characteristics. In the embodiment shown in FIG. 4, the multiband filter $F_{m,0}$, that maps a subband signal with the index m into a subband signal with the same subband index m is typically a bandpass filter with a center frequency at ($\pi/2$). In the case of a multiband filter combining three subband signals into one subband signal as a filterbank signal, the other two multiband filters $F_{m,-q(m)}$ and $F_{m,+p(m)}$ are typically either high pass or low pass filters, wherein their exact type depends on the subband index m. If the multiband filter 401 is adapted to combining more than three subband signals to obtain the filter subband signals with an index m, which is not "border" subband signal, the corresponding types of multiband filters can be bandpass filters, high pass filters, low pass filters, band stop filters or all pass filters.

The embodiments shown in FIGS. 1-3 hence describe a method for modification of a discrete-time audio signal, characterized by:
Filtering the signal by a cosine modulated analysis filter bank,
creating complex subband samples for a subset of the subbands by means of multiband filtering,
modifying both the real and the complex subband samples,
transforming the resulting complex samples to real samples by means of a multiband filtering,
filtering the real subband samples through a cosine modulated synthesis filter bank.

Figure 5:
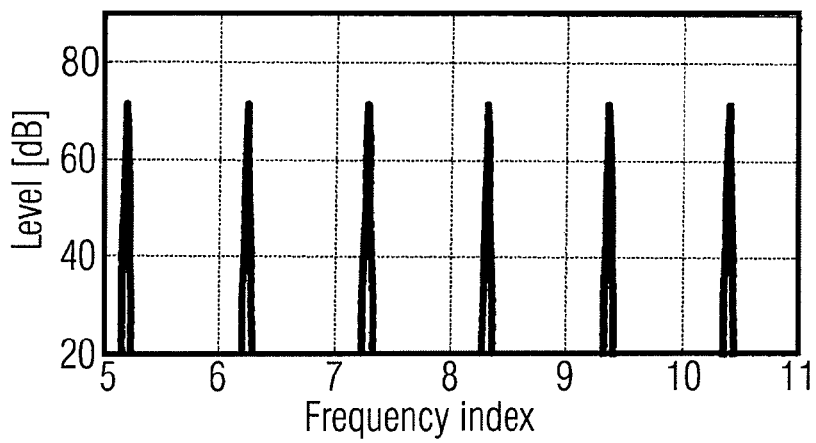
FIG. 5 illustrates the spectrum of an original signal containing multiple sinusoidal components.

FIG. 5 illustrates a part of the magnitude spectrum of an original signal containing multiple sinusoidal components. This spectrum is obtained by the use of a windowed discrete Fourier transform. The frequency axis is normalized such that the frequency index n corresponds to a discrete-time frequency equal to ($n\pi/L$) with L=64. Hence, if the sampling frequency of the digital audio signal is $f_s$, the frequency range shown in FIG. 5 goes from $(5/64) \cdot f_s/2$ to $(11/64) \cdot f_s/2$. In this normalization, the subband with index n of a complex or real modulated filter bank with L subbands has a response with main lobe centered between frequency index n and (n+1). This convention is kept for all of the FIGS. 5-9.

In other words, each subband or subband signal is associated with both, an index n or m and a center frequency of the corresponding subband. Hence, the subband signals or rather the subbands can be arranged according to the center frequencies associated with the subband signals in such a way that an increasing index can, for example, correspond to a higher frequency.

Figure 6:
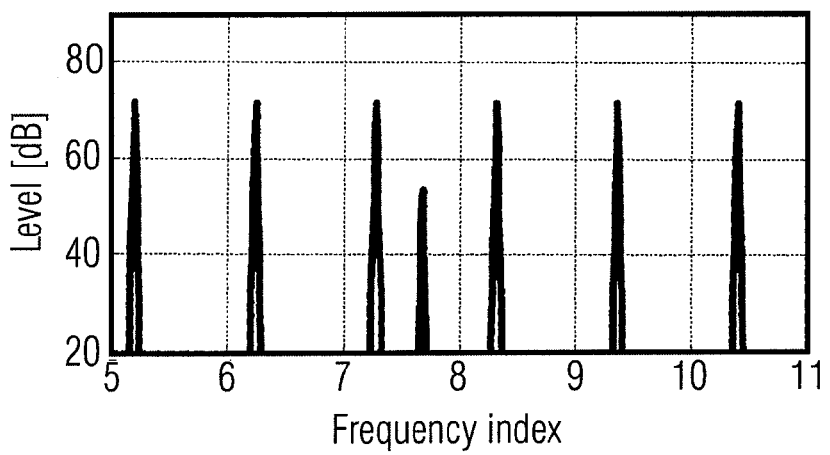
FIG. 6 illustrates the spectrum of a signal obtained by analysis and synthesis without subband modification in a partially complex filter bank that does not incorporate the seamless transition feature taught by the current invention.

FIG. 6 illustrates the spectrum of a signal obtained by analysis and synthesis without subband modification in a partially complex filter bank that does not incorporate the seamless transition feature taught by the current invention. Specifically, a more naïve approach is considered where 101 constructed out of two filter banks with L=64 subbands, the first bank is complex exponential modulated and the second bank is cosine modulated. Both filter banks yield near perfect reconstruction when used separately. The construction considered here takes the K=8 first subbands from the first complex bank and the (L-K)=56 remaining subbands from the second real bank. The input signal is identical to the signal considered in FIG. 5, and as it can be seen by comparison to FIG. 5, an alias component has been introduced near frequency index 8, which marks the transition frequency between complex and real subbands. Disregarding for a moment that the complexity of this naïve approach is in fact higher than for a single complex bank, the example shows that there is a need for a special handling of the transition between complex and real subbands. The case where no modifications are performed in 102 and 103 should preferably give rise to a digital audio output from 104 which is perceptually indistinguishable from the input to 101. The partially complex analysis and synthesis filter banks described by the present invention as in FIGS. 2 and 3 possess exactly that feature. In particular, the corresponding magnitude spectrum of the processed signal is identical to that of FIG. 5. Hence a concatenation of a multiband analysis filter or an analysis filter bank and a synthesis multiband filter or a synthesis filter bank, in other words a concatenation of a multiband analysis and synthesis filtering, should lead to near perfect reconstruction, e.g. up to a sign change.

Figure 7:
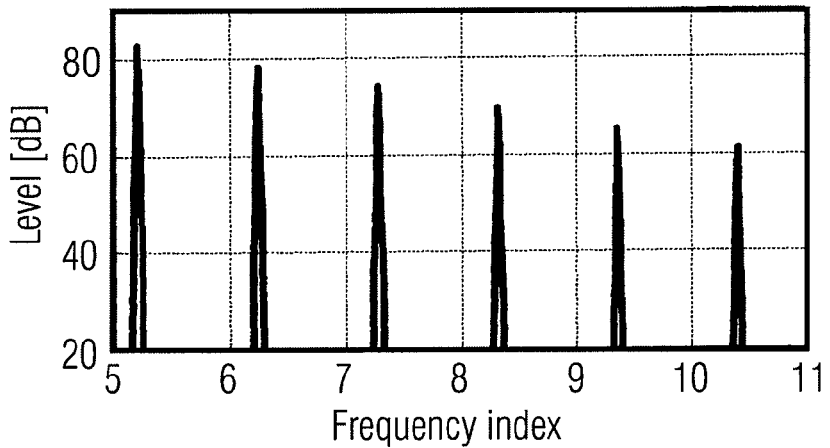
FIG. 7 illustrates the spectrum of a signal obtained by modification in the subband domain of a complex filter bank.
Figure 8:
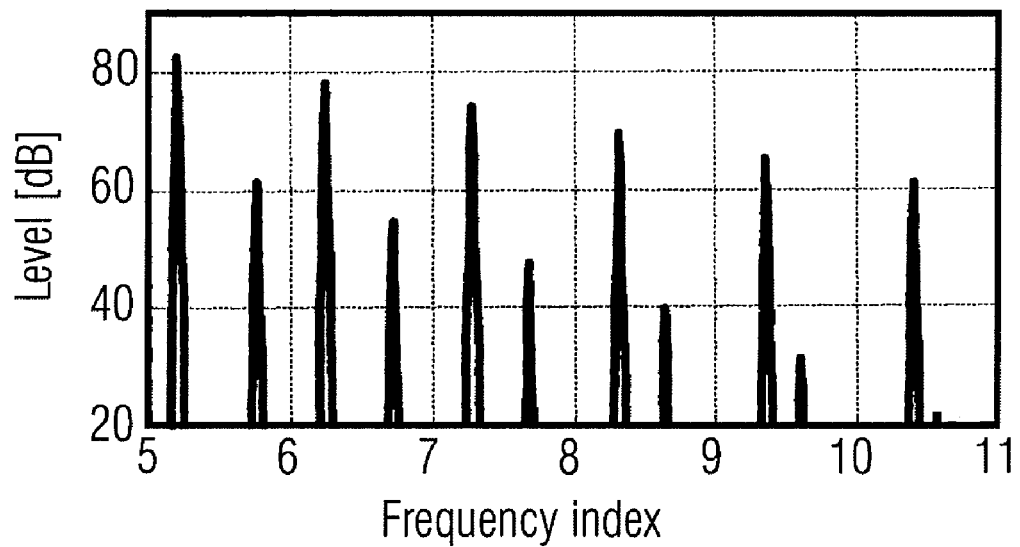
FIG. 8 illustrates the spectrum of a signal obtained by modification in the subband domain of a real filter bank.
Figure 9:
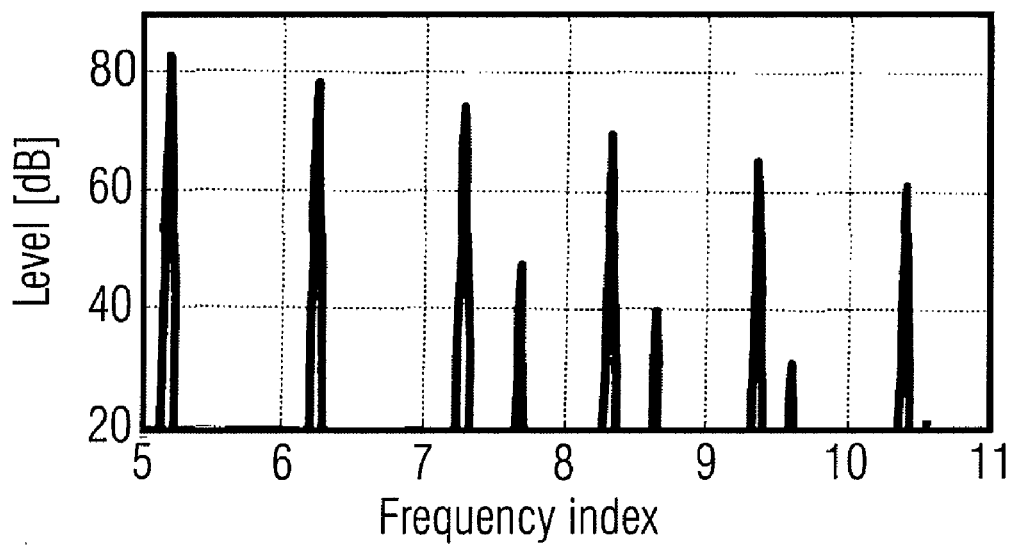
FIG. 9 illustrates the spectrum of a signal obtained by modification in the subband domain of a partially complex filter bank as taught by the current invention.

FIG. 7 illustrates the spectrum of a signal obtained by modification in the subband domain of a complex exponential modulated filter bank. The modification consists of applying a gain g(n) to the subband with index n, where g(n) is a decreasing function of n. Compared to FIG. 5, the sinusoidal components have simply changed magnitudes accordingly. This describes the desired behavior of an equalization or envelope adjustment of the original signal. Performing the same modification with a real cosine modulated filter bank leads an output signal with the frequency analysis depicted on FIG. 8. Additional aliased sinusoidal components make the result deviate considerably from the desired behavior as described by FIG. 7 and the distortion is audible. Applying the same gain modification in a partially complex filter bank as taught by FIGS. 2 and 3 realized by multiband filters as in FIG. 4 with 11 filter taps for each individual filter leads to the magnitude spectrum of FIG. 9. Again K=8 is chosen and as it can be seen, the output has the quality of complex filter bank processing (FIG. 7) below the frequency index K−0.5=7.5 and the quality of the real filter bank processing (FIG. 8) above this frequency index.

Hence, the present invention relates to systems comprising equalization, spectral envelope adjustment, frequency selective panning, or frequency selective spatialization of audio signals using a downsampled real-valued subband filter bank. It permits suppression of aliasing for a selected frequency range by transforming a corresponding subset of subband signals into complex-valued subband signals. Assuming that the aliasing outside the selected frequency range is less noticeable or can be alleviated by other methods, this permits large savings in computational effort in comparison to the use of a complex-valued filter bank.

Modulated Filter Banks

For ease of computations a complex exponential modulated L-band filter bank will be modeled here by a continuous time windowed transform using the synthesis waveforms $$e_{n,k}(t) = e_n(t-k), \quad (3)$$

where n,k are integers with n≧0 and $$e_n(t) = e_{n,0}(t) = v(t)\exp[i\pi(n+\tfrac{1}{2})(t+\tfrac{1}{2})]. \quad (4)$$

The window function v(t) is assumed to be real valued. By splitting $e_n(t) = c_n(t) + i s_n(t)$ into real and imaginary parts, one obtains the synthesis waveforms for cosine and sine modulated filter banks, $$\begin{cases} c_{n,k}(t) = c_n(t-k) \\ s_{n,k}(t) = s_n(t-k) \end{cases}. \quad (5)$$

Results for discrete-time signals and filter banks with L subbands are obtained by suitable sampling of the t-variable with spacing 1/L. Define the inner product between signals by $$\langle x, y \rangle = \int_{-\infty}^{\infty} x(t) y^*(t) dt \quad (6)$$

where the star denotes complex conjugation. For discrete-time signals the integral is replaced by a summation. The operation of a cosine and sine modulated filter bank analysis of a signal x(t) is then described by $$\alpha_n(k) = \langle x, c_{n,k} \rangle, \; \beta_n(k) = \langle x, s_{n,k} \rangle. \quad (7)$$

Given subband signals $\tilde{\alpha}_n, \tilde{\beta}_n$, the corresponding synthesis operations are $$y_c(t) = \sum_{n=0}^{\infty} \sum_{k=-\infty}^{\infty} \tilde{\alpha}_n(k) c_{n,k}(t), \quad (8)$$

$$y_s(t) = \sum_{n=0}^{\infty} \sum_{k=-\infty}^{\infty} \tilde{\beta}_n(k) s_{n,k}(t)$$

For discrete-time signals, the summation over the subband index n is limited to (L−1). It is well known from the theory of cosine/sine modulated filter banks and lapped transforms that the window function v(t) can be designed such that the combined analysis and synthesis operations lead to perfect reconstruction $y_c = y_s = x$ for unmodified subband signals $\tilde{\alpha}_n = \alpha_n$, $\tilde{\beta} = \beta_n$. For near perfect reconstruction designs, those equalities will be approximate.

The operation of a complex exponential modulated filter bank as taught by PCT/SE02/00626 "Aliasing reduction using complex exponential modulated filter banks" can be described by the complex analysis, $$\gamma_n(k) = g_a \langle x, e_{n,k} \rangle = g_a(\alpha_n(k) - i\beta_n(k)), \quad (9)$$

where $g_a$ is a fixed real analysis gain factor. The synthesis from complex subband signals $\tilde{\gamma}_n = \tilde{\alpha}_n - i\tilde{\beta}_n$ is defined by $$y_e(t) = g_s \mathrm{Re}\left\{ \sum_{n=0}^{\infty} \sum_{k=-\infty}^{\infty} \tilde{\gamma}_n(k) e_{n,k}(t) \right\} \quad (10)$$

$$= g_s g_a \sum_{n=0}^{\infty} \sum_{k=-\infty}^{\infty} (\tilde{\alpha}_n(k) c_{n,k}(t) + \tilde{\beta}_n(k) s_{n,k}(t)),$$

where $g_s$ is a fixed real synthesis gain factor. Assuming that the complex subband signals are unmodified $\tilde{\gamma}_n = \gamma_n$ and that the cosine and sine modulated banks have perfect reconstruction, one finds from (8) and (9) that $$y_e = g_s g_a (y_c + y_s) = 2 g_s g_a x. \quad (11)$$

Hence perfect reconstruction is achieved if $$g_a g_s = 1/2. \quad (12)$$

A particularly attractive choice of fixed gains leading to energy preservation of the complex subband representation is $g_a = g_s = 1/\sqrt{2}$.

It is immediate that in the complex case, deviations from the specific modulation described by (4) by a fixed phase factor for each subband can be permitted without changing the reconstruction properties, since the modification of the complex subband signals in (9) and (10) will cancel out. The complex exponential modulated filter bank is oversampled by a factor of two. With a proper window design, this enables virtually alias free envelope adjustment as shown in PCT/SE02/00626 "Aliasing reduction using complex exponential modulated filter banks". Such designs are often easier to achieve by abandoning the strictly perfect reconstruction framework described above in favor of near-perfect reconstruction.

Multiband Filtering

Assuming that only the cosine modulated bank analysis $\alpha_n(k)$ of (7) is available, the corresponding sine modulated bank analysis $\beta_m(l)$ can be obtained by combining a cosine bank synthesis step and a sine bank analysis. One finds that $$\beta_m(l) = \sum_{n=0}^{\infty} \sum_{k=-\infty}^{\infty} \alpha_n(k) \langle c_{n,k}, s_{m,l} \rangle, \quad (13)$$

where a change of time variable in the inner product leads to $$\langle c_{n,k}, s_{m,l} \rangle = \langle c_n, s_{m,l-k} \rangle. \quad (14)$$

Hence the summation with respect to k in (13) corresponds to a filtering and the overall structure is recognized as a version of the multiband filtering depicted in FIG. 4 with infinitely many bands. A re-writing in terms of the complex waveforms (4) yields $$\langle c_n, s_{m,\lambda} \rangle = \frac{1}{2} \mathrm{Im}\{ \langle e_{m,\lambda}, e_n \rangle + \langle e_{m,\lambda}, e_{-1-n} \rangle \}. \quad (15)$$

After a substitution $t \rightarrow t + \mu/2$, the first term of (15) can be expanded into $$\langle e_{m,\lambda}, e_n \rangle = \exp\left[i\frac{\pi}{2}[m - n - (m+n+1)\lambda]\right] \quad (16)$$

-continued $$\int_{-\infty}^{\infty} v(t-\lambda/2)v(t+\lambda/2)\exp[i\pi(m-n)t]\,dt.$$

With a symmetric window v(−t)=v(t), the imaginary part of the integral in (16) vanishes, such that $$\mathrm{Im}\langle e_{m,\lambda}, e_n\rangle = \sin\left[\frac{\pi}{2}[m-n-(m+n+1)\lambda]\right]h_{m-n}(\lambda), \quad (17)$$

with the definition $$h_\mu(\lambda) = \int_{-\infty}^{\infty} v(t-\lambda/2)v(t+\lambda/2)\cos[\pi\mu t]\,dt. \quad (18)$$

This expression is an even function of both μ and λ. For suitable designs of windows one can assume that $h_\mu$ vanishes for |μ|>1. In the discrete-time case, the integral in (18) is to be replaced by a summation over integers ν' with t=(ν+θ)/L, where L is the number of subbands and θ is an offset value either equal to 0 or ½. The discrete-time counterpart of (18) is periodic in μ with period 2L for θ=0 and antiperiodic in μ with period 2L for θ=½. Inserting n=m+r in (15) yields $$\langle c_{m+r}, s_{m,\lambda}\rangle = \frac{1}{2}\left\{\sin\left[\frac{\pi}{2}[-r-(2m+1+r)\lambda]\right]h_r(\lambda) + \sin\left[\frac{\pi}{2}[r\lambda+2m+1+r]\right]h_{2m+1+r}(\lambda)\right\}. \quad (19)$$

Referring to 402m in FIG. 4, $f_{m,r}(\lambda)=\langle c_{m+r}, s_{m,\lambda}\rangle$ can be used as the impulse response of the filter $F_{m,r}$ if L=K is inserted in the above computations. Assuming $h_\mu$ vanishes except for μ=2Kκ+σ where κ is an integer and σ∈{−1, 0, 1}, it follows that the second term of (19) only gives a contribution for m=0 and m=(K−1). These edge cases are important since they contain the key to near invertibility of the multiband filter 401. Apart from the trivial modulations of (19), only two prototype filters $h_0$, $h_1$ have to be considered, and an inspection of (19) shows that only the odd samples of $h_0$ come into play. Moreover it is clear for those skilled in the art that the special modulations of (19) and the similarity of the filters $f_{m+1,-1}$, and $f_{m-1,1}$ allows for a very efficient implementation of the multiband filter in polyphase form. A more detailed description of such an embodiment will be presented in the further course of this application.

For practical designs it is advantageous to abandon the discretized inner product (18) for the design of those prototype filters. Instead, for a chosen integer N the filters $f_{m,r}$ are designed to give the best approximation $$s_m \approx \sum_r \sum_{k=-N}^{N} f_{m,r}(-k)c_{m+r,k}. \quad (20)$$

This gives a second, more direct path to the sine modulated bank analysis $$\beta_m = \sum_{r=-1}^{1} f_{m,r} * \alpha_{m+r} \quad (21)$$

where the star denotes convolution. Moreover, expanding the sine synthesis operation (8) by inserting (20) and collecting the cosine terms leads to $$\tilde{a}_n(k) = \sum_{r,l} f_{n-r,r}(l-k)\tilde{\beta}_{n-r}(l), \quad (22)$$

such that the synthesis multiband filter 306 also has the structure of 401 with filters replaced by $G_{m,r}$ with impulse responses $g_{m,r}(\lambda)=f_{m+r,-r}(-\lambda)$. The same result would also follow from interchanging the role of cosine and sine modulation in the derivations above.

The total computational complexity of the multiband filter is proportional to N·K operations per subband sample period, that is, N·K/L operations per digital audio sample. When K<<L this leads to a considerable saving in comparison to additional sine modulation required for a full complex modulated filter bank.

Compared to the application of a purely real or purely complex modulated filter bank and additional delay of N subband samples is introduced by the multiband filter in both the analysis and the synthesis step. This is compensated for by delaying all the subband samples which do not pass the multiband filter by a delay of N subband samples in 202, 203, 304, and 305. In the case where the modification 103 comprises a sub-subband filtering as described in [E. Schuijers, J. Breebart, H. Purnhagen, J. Engdegård: "Low complexity parametric stereo coding", Proc. 116$^{th}$ AES convention, 2004, paper 6073], the sub-subband filters can be combined with the multiband filter 204 in order to enable a reduction of the total delay by means of approximating the combined impulse responses.

If the selected K complex subbands are the first K of a total of L subbands, the multiband filter emulates the effect of a synthesis of a filter bank with K subbands to a time domain of K/L times the original sampling frequency followed by an analysis with a filter bank with K subbands. Such a detour has the disadvantage of leading to a longer multiband filter delay than what can be achieved with the design method taught by the current invention. For applications where the number of analysis audio channels are much smaller than the number of synthesis channels, the analysis delay of the multiband filter can be avoided altogether at the price of higher computational complexity simply by performing the partially complex analysis 101 by a true complex modulated filter bank analysis with L subbands and discarding the imaginary part of the last (L−K) subbands. However, in order to make the combination with the synthesis of FIG. 3 lead to near perfect reconstruction in the case of unaltered subbands it is necessary to replace the analysis of the edge subband with index (K−1) with a special direct form filter followed by subsampling by a factor L. Hence, this filter can be obtained by studying the partially complex synthesis of FIG. 3 in the case where the edge subband with index (K−1) contains only one nonzero sample and all other subbands are zero. Although of less usefulness in terms of complexity reduction, the synthesis delay of the multiband filter can be avoided similarly by performing the partially complex synthesis 104 by a true complex modulated filter bank synthesis with L subbands for which the input subband with index (K−1) is redirected to a separate synthesis operation consisting of upsampling by a factor L followed by a special direct form filtering. The results of the complex bank synthesis from (L−1) bands and the separate one band synthesis are then added in the time domain.

The present invention relates to systems comprising equalization, spectral envelope adjustment, frequency selective panning, or frequency selective spatialization of audio signals using a downsampled real-valued subband filter bank. It permits suppression of aliasing for a selected frequency range by transforming a corresponding subset of subband signals into complex-valued subband signals. Assuming that the aliasing outside the selected frequency range is less noticeable or can be alleviated by other methods, this permits large savings in computational effort in comparison to the use of a complex-valued filter bank.

The present invention teaches how to obtain complex representation of a signal for a selected frequency range, at a computational complexity which is only slightly larger than that of a real-valued filter bank. An efficient multiband filter is applied to selected subbands of the real filter bank analysis in order to produce imaginary parts of those subband signals. The result is a partially complex modulated filter bank analysis. The complexified subbands will have the same advantages as the corresponding subbands from a complex exponentially modulated filter bank in terms of stability of energy estimation and minimal aliasing arising from linear time invariant modifications such as envelope adjustment and filtering. Prior to the real synthesis, another multiband filter converts the complex subband samples back to real subband samples. The overall quality of reconstruction and signal processing behavior is in line with that of a complex filter bank in the complexified frequency range and in line with that of a real filter bank in the remaining frequency range. A seamless transition between the two ranges arises implicitly from a particular edge band treatment taught by the present invention.

In the frame work of the modifiers or manipulators 102, 103 time varying application of spatial parameters (e.g. MPEG Surround or parametric stereo) by means of time interpolated gains or matrices should be mentioned. In the case of time invariant modifications or manipulations, the application to envelope adjustment or equalization with a feature to not introduce aliasing is important. Hence, definitions concerning an introduction of aliasing are mainly focused on time invariant cases.

Nevertheless, introducing time variance for instance in the frame work of the manipulators or modifiers 102, 103 shown in FIG. 1 represents a case in which the definition of the feature to not introduce aliasing becomes more difficult. In practice, for instance long important pieces of signals will be treated in a locally time invariant manner even in the frame work of MPEG Surround. In a further step, nonlinear manipulations can also be considered for instance in the frame work of advanced transposition methods, like high-quality SBR, which will become important. Although these advanced transposition methods comprise time variant and/or non-linear manipulations, in a first step time invariant modifications and manipulations will have to be considered.

To summarize, in the frame work of the modifiers or manipulators 102, 103, any manipulation is certainly possible and relevant as long as it requires the time frequency resolution of the resulting (partially complex) filter bank. Hence, all advantages of the manipulations 103 of a corresponding complex bank are also present in the complex part of the partially complex filter bank.

The embodiment of the present invention described in FIGS. 1-3 comprises the following features:

A method for modification of a discrete-time audio signal comprising the steps of
filtering the signal by a cosine modulated analysis filter bank,
creating complex subband samples for a subset of the subbands by means of multiband filtering,
modifying both the real and the complex subband samples,
transforming the resulting complex samples to real samples by means of multiband filtering,
filtering the real subband samples through a cosine modulated synthesis filter bank to obtain a modified discrete-time audio signal.

In the following sections an implementation of a low power version of a spatial audio tool is outlined. The low power spatial audio tool operates on real-value subband domain signals above the K-th QMF subband (QMF=quadrature mirror-filter), wherein K is a positive integer. The integer K is chosen according to the specific needs and specifications of the implementation intended. In other words, the integer K is given by details of the intended implementation, such as a bitstream info. A real-valued QMF filter bank is used in combination with an inventive real to complex converter to achieve a partially complex subband domain representation. Furthermore, the low-power spatial audio tool may incorporate additional modules in order to reduce aliasing introduced due to the real-valued processing.

Figure 10:
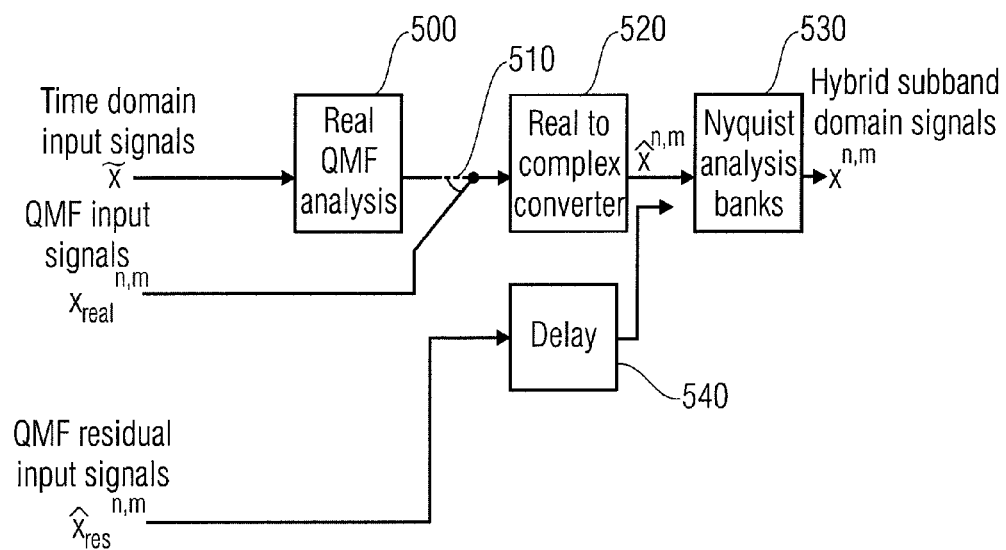
FIG. 10 illustrates a hybrid QMF analysis bank for a time/frequency transform in spatial audio coding.

Following this short introduction, the low power spatial audio coding system employs a time/frequency transform according to FIG. 10. The time/frequency transformer of the described spatial audio coding comprises a hybrid QMF analysis bank shown in FIG. 10. The hybrid QMF analysis bank to process a real QMF analysis bank 500 is connected via an optional switch 510 to an inventive real to complex converter 520. The real to complex converter 520 is furthermore connected to one or more Nyquist analysis banks 530.

The real QMF analysis bank 500 is at an input provided with time domain input signals $\tilde{x}$ and provides at an output real-valued QMF signals $\hat{x}_{real}^{n,m}$ to the real to complex converter 520. The real to complex converter 520 turns the QMF signals into partially complex samples $\hat{x}^{n,m}$, which are then provided to the Nyquist analysis banks 530, which in turn produce hybrid subband domain signals $x^{n,m}$.

Apart from the regular mode of operation of this time/frequency transformer, wherein the spatial audio decoder is set with time domain samples $\tilde{x}$, also (intermediate) real-valued (QMF) subband domain samples $\hat{x}_{real}^{n,m}$, for instance from a low-complexity HE-AAC decoder can be taken. To be more precise, in that case the subband domain samples prior to HE-AAC QMF synthesis are taken, as laid out in [ISO/IEC 14496-3:2001/AND1:2003]. To enable also these QMF input signals $\hat{x}_{real}^{n,m}$ to be fed to the inventive real to complex converter 520, the optional switch 510 is integrated into the time/frequency transformer shown in FIG. 10 and switched accordingly.

The real QMF samples, either provided in the form of QMF input signals or via the real QMF analysis bank 500, are converted to partially complex samples $\hat{x}^{n,m}$ by the real to complex converter 520, which will be described in more detail with reference to FIG. 13 below. Furthermore, as an additional option and if enabled, a residual decoding module not shown in FIG. 10 can provide subband domain samples $\hat{x}_{res}^{n,m}$ as QMF residual input signals. These QMF residual signals are also passed on to the Nyquist analysis banks 530 via an optional delayer 540, as these QMF residual input signals may also need to be passed on in a delayed form in order to compensate for a delay caused by the real to complex converter 520, before being transformed to the hybrid domain also forming hybrid subband domain signals $x^{n,m}$.

Figure 11:
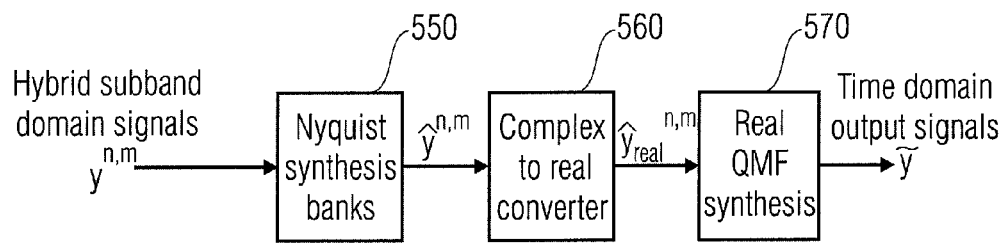
FIG. 11 illustrates a hybrid QMF synthesis bank for a time/frequency transform in spatial audio coding.

FIG. 11 shows a hybrid QMF synthesis bank for performing a frequency/time transform or rather a time/frequency transform in a spatial audio coding system. The hybrid QMF synthesis bank comprises one or more Nyquist synthesis banks 550 to which a hybrid subband domain signal $y^{n,m}$ is provided at an input. To be more precise, at the Nyquist synthesis side the hybrid subband domain samples $y^{n,m}$ are transformed to partially complex QMF subband domain samples $\hat{y}^{n,m}$ by the Nyquist synthesis banks 550. The partially complex QMF subband domain samples are then provided to an inventive complex to real converter 560, which converts the partially complex QMF subband domain samples into real-valued or rather real QMF samples $\hat{y}_{real}^{n,m}$. The inventive complex to real converter 560 will be described in more detail in context with FIG. 14. Those real QMF samples are provided to a real QMF synthesis bank 570, where they are transformed back to the time domain in the form of time domain samples or rather time domain output signals $\tilde{y}$.

The filter banks, or to be more precise, the real QMF analysis bank 500 and the real QMF synthesis bank 570 will now be described in more detail. For instance, for low power MPEG surround systems, real-valued QMF filter banks are used. In this case, the analysis filter bank 500 uses 64 channels as is outlined below. The synthesis filter bank 570 also has 64 channels and is identical to the filter bank used in low complexity HE-AAC systems as they are described in section 4.6.18.8.2.3 of ISO/IEC 14496-3. Although the following description is based on 64 channels (integer L=64), the present invention and its embodiments are not limited to using 64 channels or an appropriate number of real-valued or complex-valued subband signals. In principle, an arbitrary number of channels or rather real-valued or complex-valued subband signals can be used in context with embodiments of the present invention. However, if a different number of channels is used, the appropriate parameters of the embodiments would also have to be adapted accordingly. The real-valued QMF analysis bank 500, shown in FIG. 10, is used to split the time domain signal $\tilde{x}$ from the core decoder into 64 subband signals. The output from the filter bank or rather the real-valued QMF bank 500 are real-valued and critically sampled signals in the form of subband samples.

Figure 12:
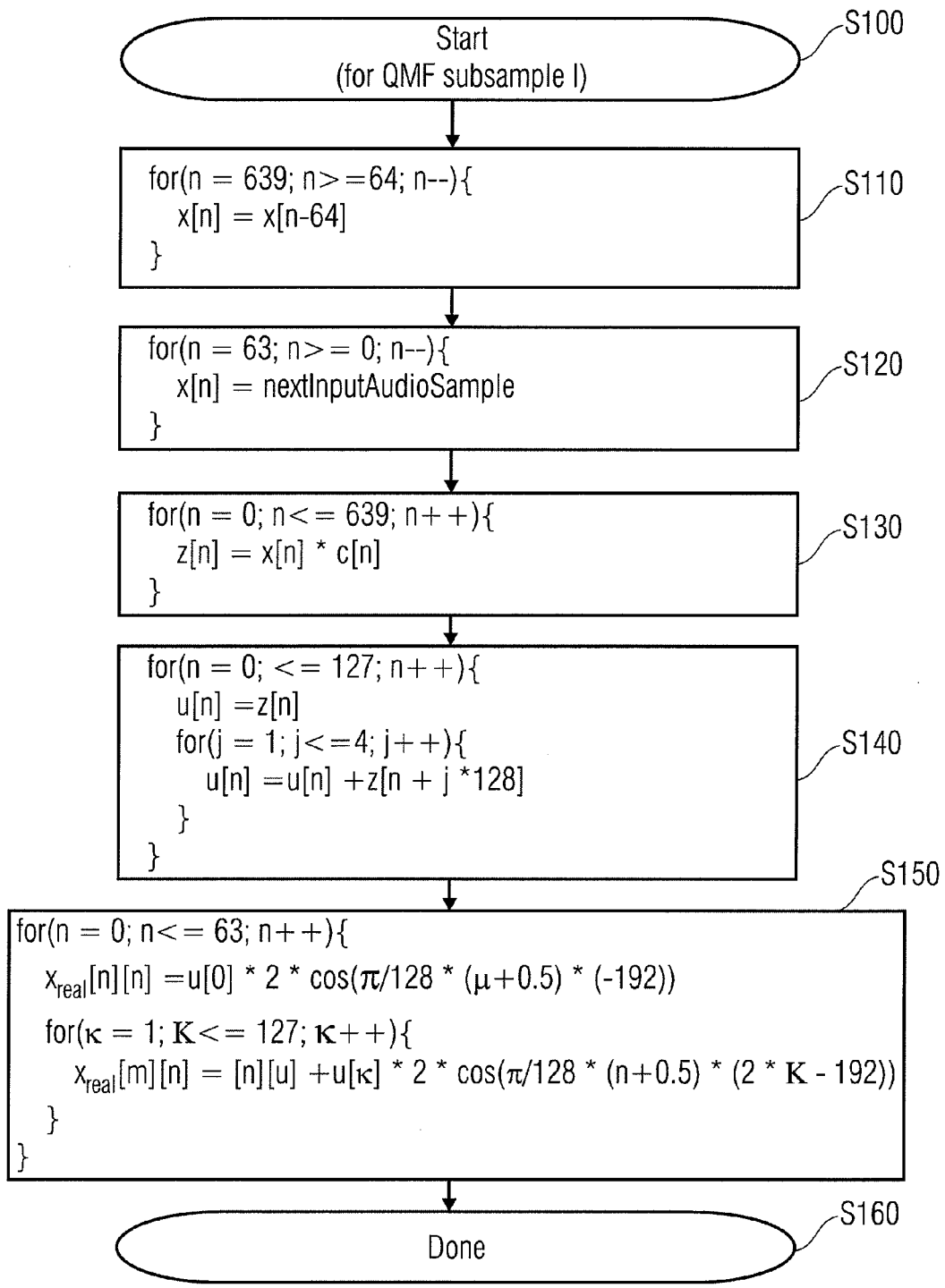
FIG. 12 shows a flowchart of a real-valued analysis QMF bank.

FIG. 12 shows a flowchart of the operation performed by the real-valued analysis QMF bank 500 in the form of C/C++—pseudocode. In other words, the method performed by the real QMF analysis bank 500 is illustrated in FIG. 12. The filtering involves the following steps, wherein an array x comprises 640 time domain input samples labeled with an index between 0 and 639. In FIG. 12, indices of arrays or vectors are enclosed by rectangular brackets. A higher index into the array x of time domain input samples corresponds to older sample.

FIG. 12 illustrates the method performed by the real QMF analysis bank 500 for a QMF subband sample l. After starting the method in step S100, the samples in the array x are shifted in step S110 by 64 positions. The oldest 64 samples with indices ranging from 575 to 639 (n=575, . . . , 639) are discarded. Afterwards, 64 new samples are stored in the array x in the positions with indices 0-63 in step S120.

In step S130 the samples of the array x are multiplied by a set of coefficients of a window or rather a window function c. The window c is also implemented as an array c with 640 elements with indices ranging from n=0, . . . , 639. This multiplication is done in step S130 by introducing a new intermediate array z with 640 elements according to $$z(n) = x(n) \cdot c(n), n = 0, \ldots, 639 \quad (23)$$

wherein the window coefficients c[0], . . . , c[639] can be found in Table 4.A.87 of ISO/IEC 14496-3.

In a following step S140 the samples represented by the intermediate array z are summed up according to $$u(n) = \sum_{j=0}^{4} z(n + j \cdot 128), \quad n = 0, \ldots, 127 \quad (24)$$

creating a new intermediate 128-element array u. Equation 24 is also shown in the flowchart of FIG. 12 as a mnemonic code representing the formula of Equation 24.

In the following step S150 new 64 subband samples are calculated by a matrix operation M·u with a matrix M, wherein the elements of the matrix M are given by $$M_r(k, n) = 2 \cdot \cos\left(\frac{\pi \cdot (k + 0.5) \cdot (2 \cdot n - 192)}{128}\right), \quad \begin{cases} 0 \le k < 64 \\ 0 \le n < 128 \end{cases} \quad (25)$$

before the method of filtering as in a step S160.

Hence, every loop of the method shown in the flowchart of FIG. 12 produces 64 subband samples, each representing the output from one filter bank subband. As already indicated, in the flowchart of FIG. 12 $X_{real}$[m][l] corresponds to a subband sample l of the QMF subband m, wherein m, l, n are all integers. Hence, the output $X_{real}$[m][n] equals a real-valued subband sample $\hat{x}_{real,k}^{n,m}$ ($\hat{x}_{real,k}^{n,m} = X_{real}$[m][n]).

Figure 13:
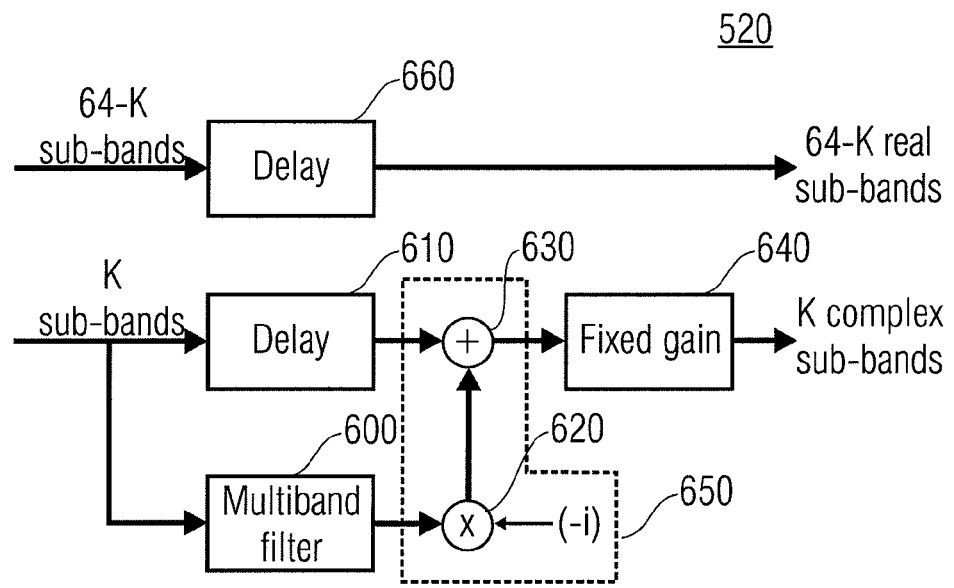
FIG. 13 shows an embodiment of an inventive apparatus for processing a plurality of real-valued subband signals as a real to complex converter.

While FIG. 12 shows the flowchart of a real-valued analysis QMF bank 500, FIG. 13 shows the inventive real to complex converter 520 from FIG. 10 in more detail. The real to complex converter 520 shown in FIG. 13 receives 64 real subband signals, which form two distinct subsets of K real subbands and (64-K) real subbands, wherein K is again a positive integer between 1 and 64. The subset of K real subband signals or subbands forms a plurality of real-valued subband signals, wherein the second subset of (64-K) real subbands forms a further plurality of real-valued subband signals.

The subset of K real-valued subband signals is provided to both a multiband filter 600 and an optional first delayer 610. The multiband filter 600 provides at an output a set of K real-valued intermediate subband signals which are provided to a multiplier 620, which multiplies each of the real-valued intermediate subband signals with a negative imaginary unit (−i). An output of the multiplier 620 is provided to an adder 630 which also receives the K real-valued subband signals in a delayed form from the delayer 610. An output of the adder 630 is further provided to a fixed gain adjuster 640. The fixed gain adjuster 640 adjusts the level of each subband signal provided at its input by multiplying the corresponding subband signal with a real-valued constant. It should be noted that the fixed gain adjuster 640 is an optional component, which is not essential for the inventive real to complex converter 520. As an output of the fixed gain adjuster 640, if implemented, or at the output of the adder 630 the real to complex converter 520 provides K complex-valued subband signals or rather K complex subbands.

The adder 630 and the multiplier 620 form together a calculator 650, which provides the complex-valued subband signal which can optionally be gain adjusted by the fixed gain adjuster 640. To be more precise, the calculator 650 combines a real-valued subband signal as a real part of the complex-valued subband signal output by the calculator 650 and the intermediate signal output by the multiband filter 600 as an imaginary part of the complex-valued subband signal.

In this context, it is important to note that the first delayer 610 is also an optional component which ensures that a possible time delay caused by the multiband filter 600 is correctly taken into account before the calculator 650 combines the intermediate signal output by the multiband filter 600 and the real-valued subband signals provided to the real to complex converter 520.

As an optional component the real to complex converter 520 also comprises a second delayer 660 which also ensures that the possible time delay caused by the multiband filter 600 does not show up in the (64-K) real-valued subband signals of the further plurality of real-valued subband signals. In order to do this, the second delayer 660 is connected in between the (64-K) real-valued subband signals, which pass the real to complex converter 520 in an unaltered way. It is important to note that the real to complex converter 520 does not necessarily comprise any real-valued subband signals being transmitted in an unaltered or only delayed form, as the integer K can also assume the value K=64, so that no real-valued subband signal pass the real to complex converter 520 in the described way.

$$\hat{x}_{imag,k}^{n,m} = \sum_{r=q(m)}^{p(m)} \sum_{v=0}^{10} f_{m,r}[v] \hat{x}_{real,k}^{n-v,m+r}, \quad m = 0, 1, \ldots, K-1 \quad (26)$$

The term $f_{m,r}[v]$ represents the filters or rather the filter functions, $\hat{x}_{real,k}^{n-v,m+r}$ represents the real-valued subband signals provided at the input of the multiband filter. Furthermore, the QMF subband summation limits are defined by $$q(m) = \begin{cases} 0, & \text{for } m = 0 \\ 1, & \text{for } m = 1, \ldots, K-1 \end{cases} \quad (27)$$

and $$p(m) = \begin{cases} 1, & \text{for } m = 0, \ldots, K-2 \\ 0, & \text{for } m = K-1 \end{cases}. \quad (28)$$

The filters $f_{m,r}[v]$ are derived from two prototype filters of the multiband filter 600, which are mainly determined by two multiband filter prototype coefficients $a^v[n]$, wherein $v=0,1$. To be more precise, the filters or rather the filter functions $f_{m,r}[v]$ fulfil the relation $$f_{m,r}[v] = \begin{cases} \sin\left[\frac{\pi}{2}[-(2m+1)(v-5)]\right]a^0[v] + (-1)^m a^1[v], & \text{if } (m,r) \in \{(0,0),(K-1,0)\} \\ \sin\left[\frac{\pi}{2}[-r-(2m+1+r)(v-5)]\right]a^{|r|}[v], & \text{else} \end{cases} \quad (29)$$

Hence, the real QMF subband signals are transformed into partially complex QMF subbands by the real to complex converter 520 as shown in FIG. 13. The first group of K real subband signals is filtered by a multiband filter 600, multiplied by the negative of the imaginary unit (-i) by the multiplier 620 and added to the K delayed real-valued subband signals by the adder 630 in order to produce K complex subband signals. As already outlined, the delayer 610, which delays the K real-valued subband signals before they are processed by the adder 630, is optional. The K complex-valued subband signals output by the adder 630 or rather the calculator 650 are gain adjusted by a fixed real gain adjuster 640 and output as the K complex subbands of the real to complex converter and, hence, of the partially complex analysis filter bank, which comprises the real to complex converter 320.

The second group comprising (64-K) real subband signals are just delayed by the optional second delayer 660, if they exist at all. The role of both optional delayers 610, 660 is to compensate for a possible delay introduced by the multiband filter 600. The length of this delay is typically related to an order of a set of multiband filters comprised in the multiband filter 600. Typically, the length of this delay is half of the order of the multiband prototype filters. This means that the delay imposed by the two optional delayers 610, 660 in the embodiment more closely specified below amounts to five subband samples. As already laid out in the sections above, especially with respect to the description of the multiband filter in FIG. 4, the multiband filter operates on the K first QMF subband signals by performing the following calculation, wherein $\hat{x}_{imag,k}^{n,m}$ represents the output of the multiband filter 600 becoming the imaginary part of the complex-valued subband signals output by the calculator 650:

wherein the multiband filter prototype coefficients $a^0[v]$ fulfils the relations given in the following Table 1:

| |
|---|
| $0.003 \leq a^0[0] \leq 0.004$ |
| $\mid a^0[1] \mid \leq 0.001$ |
| $-0.072 \leq a^0[2] \leq -0.071$ |
| $\mid a^0[3] \mid \leq 0.001$ |
| $0.567 \leq a^0[4] \leq 0.568$ |
| $\mid a^0[5] \mid \leq 0.001$ |
| $0.567 \leq a^0[6] \leq 0.568$ |
| $\mid a^0[7] \mid \leq 0.001$ |
| $-0.072 \leq a^0[8] \leq -0.071$ |
| $\mid a^0[9] \mid \leq 0.001$ |
| $0.003 \leq a^0[10] \leq 0.004$ |

Furthermore, the multiband filter prototype coefficients $a^1[v]$ fulfill the relations given in the following Table 2:

| |
|---|
| $0.0008 \leq a^1[0] \leq 0.0009$ |
| $0.0096 \leq a^1[1] \leq 0.0097$ |
| $0.0467 \leq a^1[2] \leq 0.468$ |
| $0.1208 \leq a^1[3] \leq 0.1209$ |
| $0.2025 \leq a^1[4] \leq 0.2026$ |
| $0.2388 \leq a^1[5] \leq 0.2389$ |
| $0.2025 \leq a^1[6] \leq 0.2026$ |
| $0.1208 \leq a^1[7] \leq 0.1209$ |
| $0.0467 \leq a^1[8] \leq 0.0468$ |
| $0.0096 \leq a^1[9] \leq 0.0097$ |
| $0.0008 \leq a^1[10] \leq 0.0009$ |

In other words, the filters $f_{m,r}[v]$ are derived from the prototype filters as given in Tables 1 and 2 and via Equation 29.

The output $\hat{x}_{imag,k}^{n,m}$ of the multiband filter 600 is combined by the calculator 650 with a delayed real-valued QMF subband sample $\hat{x}_{real,k}^{n-5,m}$ to form the partially complex QMF subband samples $\hat{x}_k^{n,m}$, as illustrated in FIG. 13. To be more precise, the output $\hat{x}_k^{n,m}$ fulfils the relation $$\hat{x}_k^{n,m} = \begin{cases} \frac{1}{\sqrt{2}}(\hat{x}_{real,k}^{n-5,m} - i\hat{x}_{imag,k}^{n,m}), & m = 0, 1, \ldots, K-1 \\ \hat{x}_{real,k}^{n-5,m}, & m = K, \ldots, 63 \end{cases} \quad (30)$$

wherein in the superscripts (n–5) of the real-valued QMF subband samples $\hat{x}_{real,k}^{n-5,m}$ the influence of the two delayers 610, 660 is illustrated. As mentioned before, the length of this delay is typically half of the order of the multiband prototype filter coefficients $a^v[n]$ as given in Tables 1 and 2. This amounts to five subband samples.

In a further embodiment of the present invention the multiband filter prototypes or rather multiband filter prototype coefficients $a^v[n]$ with v=0,1 fulfil the relations given in the following Tables 3 and 4:

TABLE 3

| |
|---|
| $0.00375672984183 \leq a^0[0] \leq 0.00375672984185$ |
| $\mid a^0[1] \mid \leq 0.00000000000010$ |
| $-0.07159908629243 \leq a^0[2] \leq -0.07159908629241$ |
| $\mid a^0[3] \mid \leq 0.00000000000010$ |
| $0.56743883685216 \leq a^0[4] \leq 0.56743883685218$ |
| $\mid a^0[5] \mid \leq 0.00000000000010$ |
| $0.56743883685216 \leq a^0[6] \leq 0.56743883685218$ |
| $\mid a^0[7] \mid \leq 0.00000000000010$ |
| $-0.07159908629243 \leq a^0[8] \leq -0.07159908629241$ |
| $\mid a^0[9] \mid \leq 0.00000000000010$ |
| $0.00375672984183 \leq a^0[10] \leq 0.00375672984185$ |

TABLE 4

| |
|---|
| $0.00087709635502 \leq a^1[0] \leq 0.00087709635504$ |
| $0.00968961250933 \leq a^1[1] \leq 0.00968961250935$ |
| $0.04670597747405 \leq a^1[2] \leq 0.04670597747407$ |
| $0.12080166385304 \leq a^1[3] \leq 0.12080166385306$ |
| $0.20257613284429 \leq a^1[4] \leq 0.20257613284431$ |
| $0.23887175675671 \leq a^1[5] \leq 0.23887175675673$ |
| $0.20257613284429 \leq a^1[6] \leq 0.20257613284431$ |
| $0.12080166385304 \leq a^1[7] \leq 0.12080166385306$ |
| $0.04670597747405 \leq a^1[8] \leq 0.04670597747407$ |
| $0.00968961250933 \leq a^1[9] \leq 0.00968961250935$ |
| $0.00087709635502 \leq a^1[10] \leq 0.00087709635504$ |

In a further embodiment of the present invention, the multiband filter prototype coefficients $a^v[n]$ with v=0,1 comprise the values given in the following Table 5:

| n | $a^0[n]$ | $a^1[n]$ |
|---|---|---|
| 0 | 0.00375672984184 | 0.00087709635503 |
| 1 | 0 | 0.00968961250934 |
| 2 | −0.07159908629242 | 0.04670597747406 |
| 3 | 0 | 0.12080166385305 |
| 4 | 0.56743883685217 | 0.20257613284430 |
| 5 | 0 | 0.23887175675672 |
| 6 | 0.56743883685217 | 0.20257613284430 |
| 7 | 0 | 0.12080166385305 |
| 8 | −0.07159908629242 | 0.04670597747406 |
| 9 | 0 | 0.00968961250934 |
| 10 | 0.00375672984184 | 0.00087709635503 |

As outlined in the context of the mathematical background, especially in the context of equations (18) to (20), and the properties of the expression in equation (18) mentioned above, the resulting structure of the coefficients, $a^v[n]$ comprise some symmetries. To be more exact, as also the coefficients given in table 5 above show, the coefficients of $a^v[n]$ of table 5 fulfill the symmetry relations $$a^v[10-n] = a^v[n] \quad (30a)$$

for v=0, 1 and n=0, . . . , 10 and $$a^0[2n+1] = 0 \quad (30b)$$

for n=0, . . . , 4.

Figure 14:
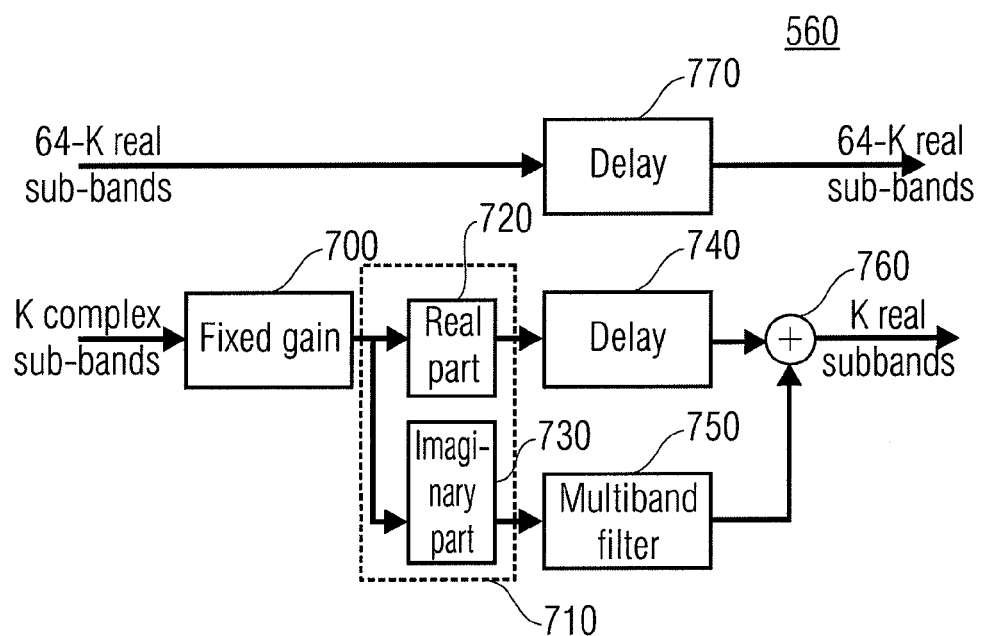
FIG. 14 shows an embodiment of an inventive apparatus for processing a plurality of complex-subband signals in the form of a complex to real converter.

Referring to FIG. 11, prior to the real QMF synthesis 570, the partially complex subband QMF signals are transformed into real-valued QMF signals by the complex to real converter 560, which is shown in more detail in FIG. 14.

The complex to real converter 560 shown in FIG. 14 receives 64 subband signals comprising K complex-valued subband signals and (64-K) real-valued subband signals. A plurality of K complex-valued subband signals or other K complex subbands are provided to a fixed gain adjuster 700, which is an optional component of the complex to real converter 560. As already outlined before, K represents a positive integer, which is in the range of 1 to 64. Furthermore, the present invention is not limited to 64 subband signals, but can also process more or less than 64 subband signals. In this case, parameters of the embodiment described below may have to be altered accordingly.

The fixed gain adjuster 700 is connected to a separator 710 or an extractor 710, as explained above, which comprises a real part extractor 720 and an imaginary part extractor 730 which both receive the output of the fixed gain adjuster 700 as an input. If, however, the optional fixed gain adjuster 700 is not implemented, the separator 710 or extractor 710 receives the K complex-valued subband signals directly. The real part extractor 720 is connected to an optional first delayer 740, while the imaginary part extractor 730 is connected to a multiband filter 750. Both, the first delayer 740 and the multiband filter 750 are connected to a calculator 760 which provides at an output K real-valued subband signals as an output of the inventive complex to real converter 560.

Furthermore, the complex to real converter 560 is provided with (64-K) real-valued subband signals, which are also in FIG. 14 referred to as real subbands, and are provided to a second delayer 770, which is also an optional component. At the output of the complex to real converter 560 the (64-K) real-valued subband signals are provided in a delayed form. If, however, the second delayer 770 is not implemented, the (64-K) real-valued subband signals are passed on in an unmodified manner.

In the embodiment shown in FIG. 14 the complex part of the partially complex QMF subband signals $\hat{y}_k^{n,m}$, i.e. the K complex-valued subband signals, are gain adjusted by the fixed gain adjuster 700. The fixed gain adjuster 700 multiplies all incoming complex-valued subband signals with the real-valued factor, e.g. $1/\sqrt{2}$. Afterwards the separator 710 splits the gain adjusted signals into real part signals $\hat{u}_k^{n,m}$, and imaginary part signals $\hat{v}_k^{n,m}$, by employing the real part extractor 720 and the imaginary part extractor 730 according to $$\hat{u}_k^{n,m} + i\hat{v}_k^{n,m} = \frac{1}{\sqrt{2}}\hat{y}_k^{n,m}, \quad m = 0, 1, \ldots, K-1 \quad (31)$$

In the embodiment shown in FIG. 14 the factor $1/\sqrt{2}$ in front of the complex-valued subband signals $\hat{y}_k^{n,m}$ is provided by the fixed gain adjuster 700.

The multiband filter 750 proceeds to operate on the imaginary part signals $\hat{v}_k^{n,m}$, which are real-valued signals, by performing the following mathematical operation:

$$\hat{w}_k^{n,m} = \sum_{r=q(m)}^{p(m)} \sum_{v=0}^{10} g_{m,r}[v] \hat{v}_k^{n-v,m+r}, \quad m = 0, 1, \ldots, K-1 \quad (32)$$

The multiband filter 750 provides a set of K real-valued intermediate subband signals $\hat{w}_k^{m,n}$. In Equation 32 the QMF subband summation limits p(m) and q(m) are defined by Equations 27 and 28 of the previous sections, respectively. Furthermore, the filters or rather filter functions $g_{m,r}[v]$ are derived from the prototype filters or rather the prototype filter coefficients as laid out in Tables 1 and 2, Tables 3 and 4 or in Table 5 via the relation:

$$g_{m,r}[v] = \begin{cases} \sin[\frac{\pi}{2}[-(2m+1)(v-5)]]a^0[v] + (-1)^m a^1[v], & \text{if } (m,r) \in \{(0,0), (K-1,0)\} \\ \sin[\frac{\pi}{2}[-r-(2m+1+r)(v-5)]]a^{|r|}[v], & \text{else} \end{cases} \quad (33)$$

To obtain the QMF signals $\hat{y}_{real,k}^{n,m}$ with respect to the K complex-valued subband signals processed by the separator 710 or extractor 710 and the multiband filter 750, the calculator 760 sums both, the intermediate subband signals output by the multiband filter 750 and the real part signals output by the separator 710 in the delayed form.

The remaining (64-K) real-valued subband signals are passed on in a delayed form due to the influence of the second delayer 770. To summarize, the QMF signals $\hat{y}_{real,k}^{n,m}$ to be fed into the real QMF synthesis bank 570 of FIG. 11 are then obtained by performing the operation:

$$\hat{y}_{real,k}^{n,m} = \begin{cases} \hat{u}_k^{n-5,m} + \hat{w}_k^{n,m}, & m = 0, 1, \ldots, K-1 \\ \hat{y}_k^{n-5,m}, & m = K, \ldots, 63 \end{cases} \quad (34)$$

As already discussed in context with Equation 30, the superscript (n-5) of both the real part signal $\hat{u}_k^{n-5,m}$ and the real-valued subband signals $\hat{y}_k^{n-5,m}$ is caused by the first delayer 740 and the second delayer 670, wherein typically the length of their delays is once again half of the order of the multiband prototype filters $a^v[n]$ as given in the tables 1 to 5. As explained, this amounts to five subband samples.

Also, as explained in context with FIG. 13, the present invention is not limited to either 64 subband signals or K complex-valued subband signals. In fact, the second delayer 770 can also be omitted as the second delayer 660 in FIG. 13, if the number of complex-valued subband signals K equals the number of all subband signals (K=64). Accordingly, although the number of overall subband signals (integer L=64) is not limiting or mandatory. By adjusting the appropriate parameters of the components shown in FIG. 14, in principle an arbitrary number of subband signals L can be used as an input for the complex to real converter 560.

The present invention is also not limited to multiband filters 204, 306, 401, 600, 750 which operate on a symmetric distribution of subband signals in relation to the index m over subband. In other words, the present invention is not limited to multiband filters, which combine subband signals or other signals with indices which are symmetrically distributed with respect to the index of the intermediate subband signal output by the multiband filter, e.g. starting from a subband with index m and an integer m' by using the subbands with indices m, (m+m') and (m-m'). Apart from the obvious restriction of subband signals with indices so small or so big that the symmetric choice of subband signals is out of the questions, the multiband filters can be designed to use individual combinations of subband signals for each intermediate subband signals output by the multiband filter. In other words, also the number of subband signals processed to obtain the intermediate subband signals can deviate from three. For instance, if a different filter with different filter coefficients is chosen, as indicated above, it might be advisable to use more than a total number of three subband signals. Furthermore, the multiband filters can be designed in a way to provide or rather output intermediate subband signals with indices, which do not correspond to indices of subband signals provided to the multiband filter. In other words, if the multiband filter outputs an intermediate subband signal with an index m, a subband signal having the same index is not necessarily required as a subband signal provided to the multiband filter.

Additionally, a system comprising one or both converters 520, 560 can comprise additional aliasing detectors and/or aliasing equalizers or rather aliasing equalization means.

Depending on certain implementation requirements of the inventive methods, the inventive method can be implemented in hardware or in software. The implementation can be performed using a digital storage medium, in particular a disc, CD or a DVD having electronically readable control signals stored thereon which cooperate with a programmable computer system such that the inventive methods are performed. Generally, the present invention is, therefore, a computer program product with a program code stored on a machine-readable carrier, the program code being operative for performing the inventive method when the computer program product runs on a computer. In other words, the inventive methods are, therefore, a computer program having a program code for performing at least one of the inventive methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concept disclosed herein and comprehended by the claims that follow.

The invention claimed is:

1. Apparatus for processing a plurality of real-valued subband signals, the plurality of real-valued subband signals comprising a first real-valued subband signal and a second real-valued subband signal, to obtain a complex-valued subband signal, comprising:
 a multiband filter for providing a real-valued intermediate subband signal based on filtering the first real-valued subband signal to obtain a first filtered subband signal and the second real-valued subband signal to obtain a second filtered subband signal and based on by combining the first filtered subband signal and the second filtered subband signal to obtain the real-valued intermediate subband signal; and a calculator for providing the complex-valued subband signal by combining the real-valued subband signal from the plurality of real-valued subband signals as a real part of the complex-valued subband signal and a signal based on the intermediate subband signal as an imaginary part of the complex-valued subband signal, wherein the plurality of real-valued subband signals is output by a real QMF analysis bank.

2. Apparatus according to claim 1, wherein the apparatus comprises a delayer for delaying the real-valued subband signal to provide the real-valued subband signal to the calculator in a delayed form.

3. Apparatus according to claim 1, wherein the apparatus comprises a gain adjuster for receiving the complex-valued subband signal from the calculator and for adjusting a value of the complex-valued subband signal.

4. Apparatus according to claim 1, wherein a multiband filter is operative to employ a low-pass filter characteristics, a high-pass filter characteristics or a bandpass filter characteristics for filtering the first real-valued subband signal and for filtering the second real-valued subband signal.

5. Apparatus according to claim 1, wherein the apparatus is operative to assign to each real-valued subband signal according to a center frequency associated with the real-valued subband signal an index m, so that the real-valued subband signals are with an increasing index m, arranged according to the center frequency associated with the real-valued subband signals, wherein the plurality of real-valued subband signals comprises K real-valued subband signals, wherein K is a positive integer and m, is an integer in the range from 0 to (K-1).

6. Apparatus according to claim 5, wherein the multiband filter is operative to provide the real-valued intermediate subband signal with an index m, which corresponds to an index m, associated with the first real-valued subband signal.

7. Apparatus according to claim 6, wherein the multiband filter is operative to use a real-valued subband signal from the plurality of real-valued subband signals, with which an index (m+1) or (m−1) is associated as the second real-valued subband signal.

8. Apparatus according to claim 6, wherein the multiband filter is operative to provide a real-valued intermediate subband signal by further filtering a third real-valued subband signal to obtain a third filtered subband signal, and by combining the first filtered subband signal, the second filtered subband signal and the third filtered subband signal to obtain the real-valued intermediate subband signal, wherein either an index of the second real-valued subband signal (m−m') and an index of the third real-valued subband signal is (m+m') or the index of the second real-valued subband signal is (m+m') and the index of the third real-valued subband signal is (m−m'), wherein m' is a positive integer, and m is the index of the first real-valued subband signal.

9. Apparatus according to claim 8, wherein the multiband filter is operative to provide a real-valued intermediate subband signal for each real-valued subband signal as the first real-valued subband signal from the plurality of real-valued subband signals with an index m−q(m) from, wherein the index of the second real-valued subband signal is m and the index of the third subband signal is (m+q(m)).

10. Apparatus (210; 520) according to claim 5, wherein the multiband filter is operative to provide K intermediate real-valued subband signals having a value $\hat{x}_{imag,k}^{n,m}$, wherein n and m are positive integers, based on the equation $$\hat{x}_{imag,k}^{n,m} = \sum_{r=q(m)}^{p(m)} \sum_{v=0}^{10} f_{m,r}[v] \hat{x}_{real,k}^{n-v,m+r}, \quad m = 0, 1, \ldots, K-1$$

for each of the K real-valued subband signals with the index m in the range of 0 to (K-1) and v is an integer in the range from 0 to 10, wherein $$f_{m,r}[v] = \begin{cases} \sin[\frac{\pi}{2}[-(2m+1)(v-5)]]a^0[v] + (-1)^m a^1[v], & \text{if } (m,r) \in \{(0,0), (K-1,0)\} \\ \sin[\frac{\pi}{2}[-r-(2m+1+r)(v-5)]]a^{|r|}[v], & \text{else} \end{cases}$$

wherein $a^0[v]$ and $a^1[v]$ are coefficients of a prototype filter, and wherein each coefficient of the prototype filter $a^0[v]$ and $a^1[v]$ obey the relations $$0.003 \leq a^0[0] \leq 0.004$$
$$|a^0[1]| \leq 0.001$$
$$-0.072 \leq a^0[2] \leq -0.071$$
$$|a^0[3]| \leq 0.001$$
$$0.567 \leq a^0[4] \leq 0.568$$
$$|a^0[5]| \leq 0.001$$
$$0.567 \leq a^0[6] \leq 0.568$$
$$|a^0[7]| \leq 0.001$$
$$-0.072 \leq a^0[8] \leq -0.071$$
$$|a^0[9]| \leq 0.001$$
$$0.003 \leq a^0[10] \leq 0.004$$

and $$0.0008 \leq a^1[0] \leq 0.0009$$
$$0.0096 \leq a^1[1] \leq 0.0097$$
$$0.0467 \leq a^1[2] \leq 0.0468$$
$$0.1208 \leq a^1[3] \leq 0.1209$$
$$0.2025 \leq a^1[4] \leq 0.2026$$
$$0.2388 \leq a^1[5] \leq 0.2389$$
$$0.2025 \leq a^1[6] \leq 0.2026$$
$$0.1208 \leq a^1[7] \leq 0.1209$$
$$0.0467 \leq a^1[8] \leq 0.0468$$
$$0.0096 \leq a^1[9] \leq 0.0097$$
$$0.0008 \leq a^1[10] \leq 0.0009.$$

11. Apparatus (210; 520) according to claim 10, wherein the multiband filter is designed so that the coefficients of the prototype filters $a^0[v]$ and $a^1[v]$ obey the relations $$0.00375672984183 \leq a^0[0] \leq 0.00375672984185$$
$$|a^0[1]| \leq 0.00000000000010$$
$$-0.07159908629243 \leq a^0[2] \leq -0.07159908629241$$
$$|a^0[3]| \leq 0.00000000000010$$
$$0.56743883685216 \leq a^0[4] \leq 0.56743883685218$$
$$|a^0[5]| \leq 0.00000000000010$$
$$0.56743883685216 \leq a^0[6] \leq 0.56743883685218$$

-continued $$
\begin{aligned}
&| a^0[7] | \leq 0.00000000000010 \\
-0.07159908629243 \leq\ &a^0[8] \leq -0.07159908629241 \\
&| a^0[9] | \leq 0.00000000000010 \\
0.00375672984183 \leq\ &a^0[10] \leq 0.00375672984185
\end{aligned}
$$

and $$
\begin{aligned}
0.00087709635502 \leq\ &a^1[0] \leq 0.00087709635504 \\
0.00968961250933 \leq\ &a^1[1] \leq 0.00968961250935 \\
0.04670597747405 \leq\ &a^1[2] \leq 0.04670597747407 \\
0.12080166385304 \leq\ &a^1[3] \leq 0.12080166385306 \\
0.20257613284429 \leq\ &a^1[4] \leq 0.20257613284431 \\
0.23887175675671 \leq\ &a^1[5] \leq 0.23887175675673 \\
0.20257613284429 \leq\ &a^1[6] \leq 0.20257613284431 \\
0.12080166385304 \leq\ &a^1[7] \leq 0.12080166385306 \\
0.04670597747405 \leq\ &a^1[8] \leq 0.04670597747407 \\
0.00968961250933 \leq\ &a^1[9] \leq 0.00968961250935 \\
0.00087709635502 \leq\ &a^1[10] \leq 0.00087709635504.
\end{aligned}
$$

12. Apparatus according to claim 5, wherein the calculator is operative to provide K complex-valued subband signals with an index m and a value $\hat{x}_{imag,k}^{n,m}$, wherein k, n, m are integers, wherein m is in the range from 0 to (K-1), based on the equation $$\hat{x}_k^{n,m} = \frac{1}{\sqrt{2}}(\hat{x}_{real,k}^{n-5,m} - i\hat{x}_{imag,k}^{n,m}), \quad m = 0, 1, \ldots, K-1$$

wherein $\hat{x}_{real,k}^{n,m}$ represents a value of a real-valued subband signal and $\hat{x}_{imag,k}^{n,m}$ represents a value of a real-valued intermediate subband signal and i represents the complex unit according to $$i = \sqrt{-1}.$$

13. Apparatus according to claim 5, wherein the apparatus is operative to receive a further plurality of real-valued subband signals comprising (L-K) real-valued subband signals and to provide the further plurality of real-valued subband signals as real-valued subband signals, wherein L is a positive integer and wherein L is greater or equal to K.

14. Apparatus (210; 520) according to claim 13, wherein the apparatus is designed so that the positive integer L equals 64.

15. Apparatus according to claim 13, wherein the apparatus comprises a further delayer for delaying the real-valued subband signals of the further plurality of real-valued subband signals and wherein the apparatus is operative to provide the further plurality of real-valued band signals in a delayed form.

16. System comprising:
an analysis filter bank for processing an audio input signal into a plurality of real-valued subband signals;
an apparatus for processing the plurality of real-valued subband signals to obtain a complex-valued subband signal according to claims 1;
a modifier for receiving the complex-valued subband signal and for providing the complex-valued subband signal in a modified form;
an apparatus to obtain a real-valued subband signal; and
a synthesis filter bank for processing the real-valued subband signal into an audio output signal.

17. System according to claim 16, wherein the analysis filterbank is designed such that the plurality of real-valued subband signals comprises L real-valued subband signals,
wherein L is a positive integer, wherein the apparatus for processing the plurality of real-valued subband signals is designed such that the apparatus provides a plurality of complex-valued subband signals and a further plurality of real-valued subband signals;
wherein the plurality of complex-valued subband signals comprises K complex-valued subband signals and the further plurality of real-valued subband signals comprise (L-K) real-valued subband signals;
wherein K is an integer in the range from 1 to L;
wherein the modifier is operative to modify the K complex-valued subband signals of the plurality of complex-valued subband signals to provide K complex-valued subband signals in a modified form;
wherein the system further comprises a further modifier for modifying the further plurality of real-valued subband signals and for providing the further plurality of real-valued subband signals in a modified form;
wherein the apparatus is designed to process the plurality of complex-valued subband signals comprising K real-valued subband signals and the further plurality of real-valued subband signals comprising (L-K) real-valued subband signals to obtain a final plurality of real-valued subband signals,
wherein the final plurality of real-valued subband signals comprises L real-valued subband signals; and
wherein the synthesis filter band is designed such that the final plurality of real-valued subband signals is processed into the audio output signal.

18. Method for processing a plurality of real-valued subband signals, the plurality of real-valued subband signals comprising a first real-valued subband signal and a second real-valued subband signal to obtain a complex-valued subband signal, comprising:
filtering, by a multiband filter, the first real-valued subband signal to obtain a first filtered subband signal and the second real-valued subband signal to obtain a second filtered subband signal;
combining the first filtered subband signal and the second filtered subband signal when deriving a real-valued intermediate subband signal; and
combining, by a calculator, a real-valued subband signal from the plurality of real-valued subband signals as a real part of a complex-valued subband signal and a signal which is based on the intermediate subband signal as an imaginary part of the complex-valued subband signal,
wherein the plurality of real-valued subband signals is output by a real QMF analysis bank.

19. Non-transitory storage medium having stored thereon a computer program for performing, when running on a computer, a method in accordance with the method of claim 18.

* * * * *